US008901973B2

(12) United States Patent
Ehlers et al.

(10) Patent No.: US 8,901,973 B2
(45) Date of Patent: Dec. 2, 2014

(54) MULTI-BAND FREQUENCY MULTIPLIER

(71) Applicant: Keysight Technologies, Inc., Minneaoplis, MN (US)

(72) Inventors: Eric R. Ehlers, Loveland, CO (US); Bobby Yubo Wong, Loveland, CO (US)

(73) Assignee: Keysight Technologies, Inc., Santa Rosa, CA (US)

( * ) Notice: Subject to any disclaimer, the term of this patent is extended or adjusted under 35 U.S.C. 154(b) by 0 days.

(21) Appl. No.: 13/866,634

(22) Filed: Apr. 19, 2013

(65) Prior Publication Data

US 2014/0312937 A1    Oct. 23, 2014

(51) Int. Cl.
*H03B 19/00*  (2006.01)
*H03B 19/06*  (2006.01)

(52) U.S. Cl.
CPC .................................. *H03B 19/06* (2013.01)
USPC ............................. 327/119; 327/212; 377/48

(58) Field of Classification Search
CPC . H03K 5/00006; H03K 5/145; H03D 7/1483; H03B 19/10
USPC ........................ 327/191–123, 212; 377/47, 48
See application file for complete search history.

(56) References Cited

U.S. PATENT DOCUMENTS

| | | | | |
|---|---|---|---|---|
| 6,664,824 B2* | 12/2003 | Laws | ............................. | 327/122 |
| 6,864,728 B1* | 3/2005 | Lu | ................................. | 327/122 |
| 6,959,178 B2* | 10/2005 | Macedo et al. | ............... | 455/313 |
| 6,985,702 B2* | 1/2006 | Hahn | ............................... | 455/77 |
| 7,091,757 B2* | 8/2006 | Masuda | ........................ | 327/122 |
| 7,132,727 B2* | 11/2006 | Momtaz et al. | ............... | 257/528 |
| 7,132,900 B2* | 11/2006 | Yahagi et al. | .............. | 331/108 C |
| 7,230,503 B1* | 6/2007 | Huang | ....................... | 331/117 R |
| 7,245,164 B2* | 7/2007 | Ito | .................................. | 327/116 |
| 7,415,257 B2* | 8/2008 | Chou et al. | ..................... | 455/130 |
| 7,545,855 B2* | 6/2009 | Afsahi et al. | ................... | 375/219 |
| 7,546,095 B2* | 6/2009 | Arimura | ......................... | 455/112 |
| 7,633,341 B2* | 12/2009 | Bagheri et al. | ................ | 330/253 |
| 8,330,506 B2 | 12/2012 | Trotta et al. | | |
| 2007/0152764 A1* | 7/2007 | Lin | .................................. | 331/57 |
| 2012/0276857 A1 | 11/2012 | Gao et al. | | |

OTHER PUBLICATIONS

Fisher, et al.; A 77-GHz SiGe Frequency Multiplier (x18) for Radar Transceivers; Bipolar/BiCMOS Circuits and Technology Meeting (BCTM); Oct. 4-6, 2010; 2010 IEEE; pp. 73-76.

* cited by examiner

*Primary Examiner* — Thomas J Hiltunen

(57) ABSTRACT

A multi-band frequency multiplier configured to generate frequencies and multiplied frequencies in an integrated system. The multi-band frequency multiplier includes a multi-band multiplier core with a multiplier core differential amplifier configured to receive a multiplier input signal. A switchable load impedance connects to the multiplier core differential amplifier, and includes n multiplier sections. Each multiplier section includes a section impedance and a section switch. The multiplier core differential amplifier generates an output signal having a frequency substantially equal to k times the input frequency in a range of a selected one of n critical frequencies when a selected one of the section switches corresponding to the selected one of the n critical frequencies is triggered.

20 Claims, 11 Drawing Sheets

MULTI-BAND FREQUENCY MULTIPLIER

TECHNICAL FIELD

The present invention relates to frequency multipliers, and more particularly, to multi-band frequency multipliers.

BACKGROUND

Frequency multipliers are devices that multiply the frequency of an input signal by a desired number. Frequency multipliers are typically used in radio frequency ("RF") and microwave test instruments and communications systems to extend the frequency range of lower frequency sources. The multiplied signals may be generated using non-linear devices, which may include either passive (such as Schottky diodes) or active (such as Field Effect Transistors or Bipolar Junction Transistors) devices. Diodes generally operate at higher frequencies than transistors and are the preferred choice for the highest frequency multipliers. However, diodes typically require higher power to operate and have higher conversion loss. Transistors, on the other hand, are convenient to use since they have a gain and can generate multiplied frequencies at lower power levels.

Frequency multipliers include non-linear elements for generating frequency harmonics of the input signal. The generated harmonics of the input signal are output as the desired multiplied signals. The critical frequency of the input signal is typically suppressed in the multiplier so that the output signal has primarily harmonic frequencies. A multiplier is usually designed to suppress the critical frequency and enhance either the even harmonics ($2f_o$, $4f_o$, $6f_o$, etc.) or the odd harmonics ($3f_o$, $5f_o$, $7f_o$, etc.). Such frequency multipliers are called even harmonic multipliers and odd harmonic multipliers, respectively, or more commonly, frequency doublers and frequency triplers, respectively.

A significant disadvantage of existing frequency multipliers is that they perform a single function by operating over a specific multiplication frequency band. It is common in communications systems and test instruments to need signals at either the critical frequency or at multiplied frequencies depending on the state of the system. The specific multiplication frequency band may not provide a sufficient range of frequencies. Existing frequency multipliers are single multiplication frequency band devices that are connected with switching networks to select signals at different multiplied frequency bands or at the critical frequency.

In view of the foregoing, there is an ongoing need for frequency multipliers capable of generating multiplied frequencies in different multiplication frequency bands.

SUMMARY

To address the foregoing problems, in whole or in part, and/or other problems that may have been observed by persons skilled in the art, the present disclosure provides methods, processes, systems, apparatus, instruments, and/or devices, as described by way of example in implementations set forth below.

According to one implementation, a frequency multiplier is provided. An example frequency multiplier comprises an input amplifier configured to receive a frequency multiplier input signal having an input frequency, and to generate a suitably amplified multiplier input signal. The frequency multiplier includes a multi-band multiplier core configured to permit selection of multiple frequency bands. A multiplier core differential amplifier receives the multiplier input signal. The multiplier core differential amplifier includes a multiplier core differential output. A switchable load impedance connects to the multiplier core differential output. The switchable load impedance comprises n multiplier sections. Each multiplier section includes a section impedance and a section switch. The multiplier core differential output generates an output signal having a multiplied frequency substantially equal to k times the input frequency. The multiplied frequency is in a range of a selected one of n critical frequencies when a selected one of the section switches corresponding to the selected one of the n critical frequencies is triggered. A load resistor connects to the switchable load impedance opposite the multiplier core differential output.

Other devices, apparatus, systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The invention can be better understood by referring to the following figures. The components in the figures are not necessarily to scale, emphasis instead being placed upon illustrating the principles of the invention. In the figures, like reference numerals designate corresponding parts throughout the different views.

DETAILED DESCRIPTION

As used herein, the term "fundamental frequency" refers to a frequency that is to be multiplied by extraction of a harmonic of the fundamental frequency. The fundamental frequency may refer to any frequency to which the input signal to the frequency multiplier is set.

As used herein, the term "tripler" refers to a frequency multiplying function, component, system, device, or method that triples the frequency of an input signal. The tripling function refers to the extraction of the third harmonic from the fundamental frequency. The term "tripler" is not intended to be limiting multiplication of a frequency value to a multiple of 3. Any multiple of the input frequency may be used as well, which would refer to the extraction of any of the harmonics whether odd or even of the fundamental frequency.

Figure 1:
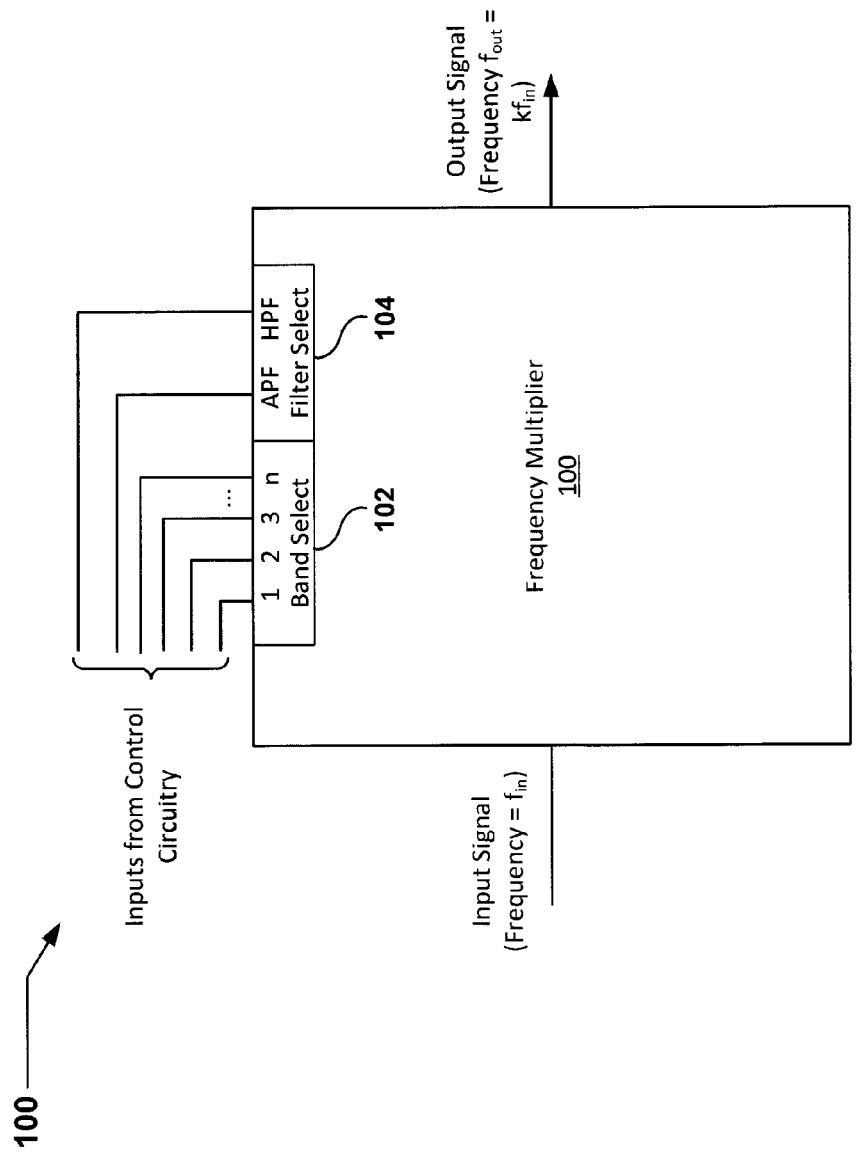
FIG. 1 is a block diagram of an example implementation of a multi-band frequency multiplier.

FIG. 1 is a block diagram of an example implementation of a multi-band frequency multiplier 100 configured to receive an input signal at a given frequency $f_{in}$ and to generate an output signal having a frequency that is the input frequency multiplied by an integer. The integer multiple may be an even or odd integer corresponding to either an even or odd harmonic of the input frequency.

The multi-band frequency multiplier 100 in FIG. 1 includes a band select function 102 and a filter select function 104. The band select function 102 permits selection of one of n different frequency multiplication bands, or of a pass-through band in which the input frequency is pass-through to a frequency multiplier output signal. Each frequency multiplication band comprises a range of frequencies that are a selected harmonic ($k^{th}$, where k>1) of the input frequency, where the input frequency, $f_{in}$, is in a range around a critical frequency, $f_0$. The frequency of the frequency multiplier output signal in FIG. 1 is $f_{out}=kf_{in}$. In operation, a user may select a pass-through band to generate the output signal at the same frequency as the input signal. The pass-through band may be the normal, un-multiplied range of output frequency values of a frequency generator, for example. As used herein, the term "pass-through mode" shall refer to a mode of operation in which the pass-through band of operation is selected.

A user may select a first multiplication band (for example, 'band 1' in FIG. 1) to generate an output signal with a frequency that is k×the input frequency, where the input frequency is in a range around a Band 1 critical frequency (Band 1 $f_0$). As used herein, the term "Band n mode" shall refer to a mode of operation in which one of the n frequency multiplication bands is selected. In the band 1 mode, the band 1 critical frequency, band 1 $f_0$, may be a frequency that is within the range of frequencies generated in the pass-through mode. A different frequency may be selected as the critical frequency for the band 2 mode and the band 3 mode.

The filter select function 104 permits selection of a filter mode. The multi-band frequency multiplier 100 in FIG. 1 includes two filter modes: an all-pass filter mode and a high-pass filter mode. The high-pass filter mode may be selected to generate output signals with high frequencies generated as a third-harmonic of the input frequency such that the input frequency is suppressed.

The band select function 102 and the filter select function 104 may be controlled by control circuitry that generates signals to each input of the band select function 102 and the filter select function 104. The control circuitry may be implemented using any suitable control circuit, including for example, a digital processor, digital logic circuitry, or completely analog circuitry in which a user's selection is electrically communicated to the multi-band frequency multiplier 100.

The multi-band frequency multiplier 100 in FIG. 1 provides a switchable frequency multiplier in which one of several frequency multiplication bands may be selected. By setting each frequency multiplication band to multiply input frequencies around different critical frequencies, the original range of frequencies may be expanded to permit the output of a wide range of multiplied frequencies. The multi-band frequency multiplier 100 may be advantageously implemented as a sub-system for operation in a variety of systems and devices that require frequency generation, such as frequency generators, test instruments, and communication systems. The multi-band frequency multiplier 100 may be advantageously implemented as an integrated circuit.

Figure 2:
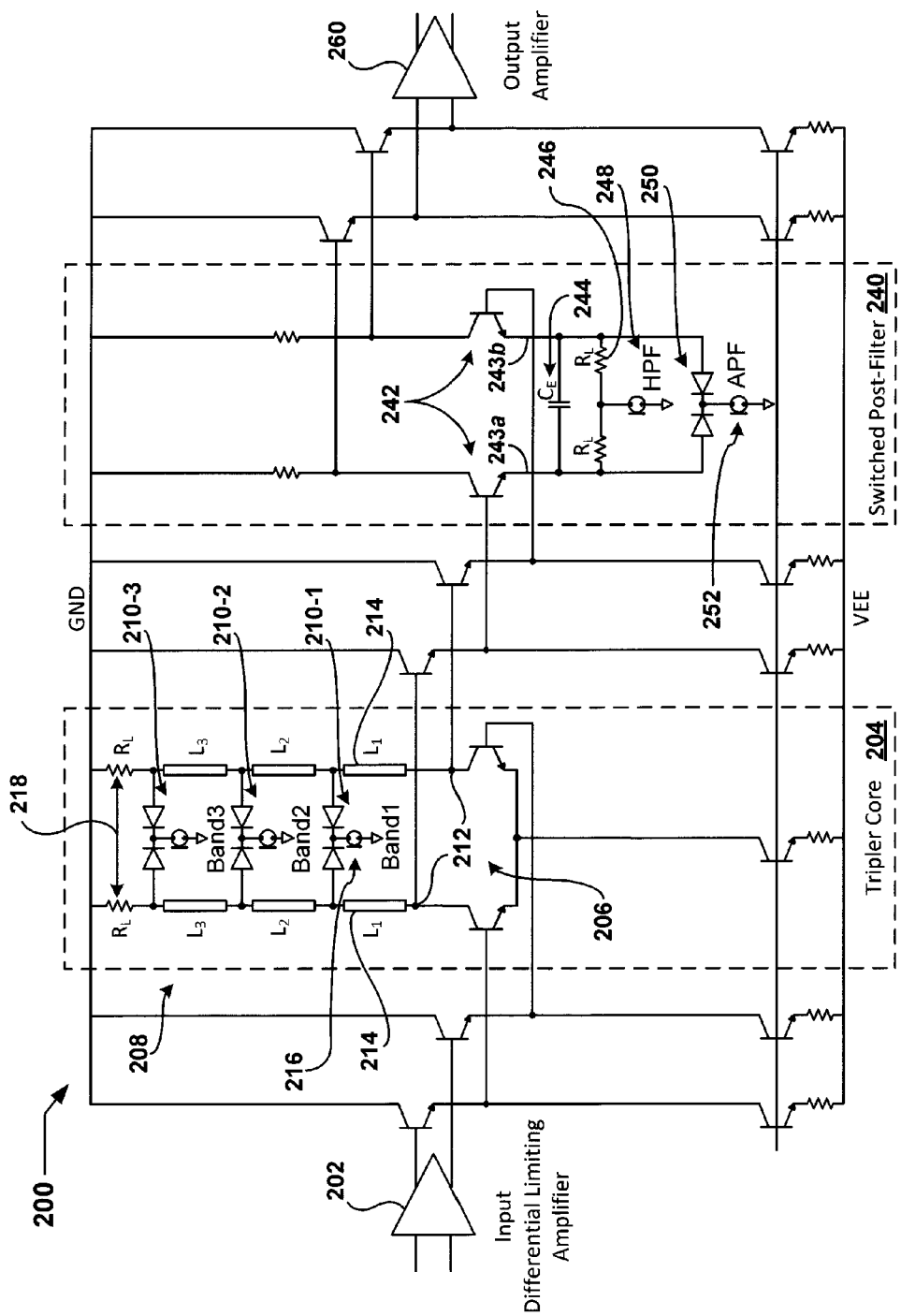
FIG. 2 is a schematic diagram of an example implementation of a multi-band frequency multiplier.

FIG. 2 is a schematic diagram of an example implementation of a multi-band frequency multiplier 200. The multi-band frequency multiplier 200 in FIG. 2 includes an input amplifier 202 configured to receive a frequency multiplier input signal having an input frequency in a range of frequencies surrounding a selected fundamental frequency. The input amplifier 202 generates a suitably amplified multiplier input signal at the frequency of the frequency multiplier input signal. The input amplifier 202 may be implemented using any suitable amplifying circuit using a non-linear device with a gain. The input amplifier 202 in FIG. 2 is a differential input, differential output limiting amplifier. In one example, the input amplifier 202 may be an input differential liming amplifier. The input signal may be a square wave or a sine wave signal applied to the input to the multi-band frequency multiplier 200. The input amplifier 202, implemented as a high gain differential pair amplifier, propagates the square wave or converts the sine wave signal to a square wave signal. This is a non-linear process that generates harmonics of the fundamental frequency, or the input frequency. The generated square wave signal has high frequency content-harmonics of the fundamental frequency, which is inherent in the fast rise and fall times at the edges of the generated output square wave signal. The amplified multiplier input signal is composed of the fundamental frequency and odd harmonics of the fundamental frequency. The input signal may be generated with a 50% duty cycle when k is odd to pass an odd harmonic. The input signal may have a different duty cycle depending on the harmonic to be selected as the multiplier. The input signal may be generated as a train of pulses, which would have equal magnitudes of odd and even harmonics so that specific even or odd harmonics can be enhanced.

The multi-band frequency multiplier 200 in FIG. 2 includes a multi-band frequency multiplier core 204. It is noted that the examples described herein refer to 'tripler cores,' however, in other implementations, multiplier cores that multiply to achieve frequencies that are harmonics other than the third harmonic of the fundamental frequency may be used as well. The multi-band frequency multiplier core 204 includes a multiplier core differential amplifier 206 configured to receive the multiplier input signal at the differential pair input of the multiplier core differential amplifier 206. The multiplier core differential amplifier 206 includes a multiplier core differential output 212 coupled to a load configured as a switchable load impedance 208. In example implementations, the multi-band frequency multiplier core 204 may be an integrated multi-band multiplier core implemented as a modular sub-system, such as on an integrated circuit.

The switchable load impedance 208 comprises 3 multiplier sections 210-1, 210-2, 210-3. Each of the multiplier sections 210-1-210-3 corresponds to one of the three frequency multiplication bands (band 1, band 2, and band 3), which implements a corresponding band mode. Each of the multiplier sections 210-1-210-3 comprises a section impedance 214 and a section switch 216. The multiplier core differential output 212 generates an output signal having a frequency substantially equal to k times the input frequency. The output signal frequency is in a range of a selected one of n critical frequencies, where n=3. The three critical frequencies correspond to critical frequencies of each of the three multiplier sections 210-1, 210-2, 210-3 and each multiplier section is configured to output a range of frequencies around the critical frequency. A selected one of the section switches 216 corresponding to the selected one of the three critical frequencies is triggered to select one of the band modes. The band mode selected corresponds to a range of output frequencies that includes the desired output frequency and the critical frequency corresponding to the selected band mode.

In general, the section impedance for each of the n multiplier sections has an impedance value such that the n multiplier sections has an impedance value selected such that:
  when no switch is triggered, the multi-band multiplier core operates in a pass-through band that generates a frequency multiplier output signal at the input frequency;
  when a selected one of the n switches is triggered, the multi-band multiplier core operates in one of n multiplier bands to generate a $k^{th}$ harmonic of the frequency multiplier input signal in a range of the one of the n critical frequencies corresponding to the selected switch.

The multi-band frequency multiplier 200 includes a load resistor 218 connected to the switchable load impedance 208 opposite the multiplier core differential output 212. It is noted that the load resistor 218 is actually two resistors, each connected to a branch of the collector load at the multiplier core differential output 212. Similarly, the multiplier sections 210 include signal paths to each branch of the collector load at the multiplier core differential output 212. The multi-band frequency multiplier 200 in FIG. 2 uses a differential amplifier in the input amplifier 202, the multiplier core differential amplifier 206, and for other amplifier functions described below. The use of differential amplifiers is shown to illustrate example implementations, and is not intended to be limiting. Any suitable amplifier configuration may be used. The configuration of the switchable load impedance 208 and load resistor 218 would be modified accordingly.

The multi-band frequency multiplier core 204 in the multi-band frequency multiplier 200 in FIG. 2 may be implemented as a sub-system or integrated circuit that may be inserted to operate in a frequency multiplier as appropriately specified. In an example implementation, the entire multi-band frequency multiplier 200 is implemented on a single integrated circuit, or "chip."

The multiplier core differential output 212 may be connected to a filter input amplifier 235, shown in FIG. 2 as implemented using a differential amplifier. The filter input amplifier 235 is connected to a switched filter 240. The switched filter 240 includes a filter differential pair amplifier 242 implemented as a differential pair with a first transistor 243a and a second transistor 243b. A filter capacitor 244 is connected across an emitter on the first transistor 243a and an emitter on the second transistor 243b. A series-connected filter resistor pair 246 is connected in parallel with the filter capacitor 244 across the emitter of the first transistor 243a and the emitter of the second transistor 243b. A diode pair 250 is connected in parallel with the filter capacitor 244 across the emitter of the first transistor 243a and the emitter of the second transistor 243b. The diode pair 250 is connected so that each diode of the diode pair 250 is forward biased towards a switch node 251 between the diode pair 250.

Two switches are provided in the switched filter 240 circuit. An all-pass filter switch 252 is connected at the switch node 251 to forward-bias each diode when the all-pass filter switch 252 is triggered on. In operation, the all-pass filter switch 252 may be used when the multi-band frequency multiplier core 204 is operating in a pass-through mode in which the input frequency (or fundamental frequency in the context of the multiplier sections 210) is passed through as the output frequency. The second switch is a high-pass filter switch 248 connected at a node between the resistors in the series-connected filter resistor pair 246. The high-pass filter switch 248 sinks each resistor when turned on to reverse bias each diode in the diode pair 250 to generate a multiplied frequency while suppressing the fundamental frequency. The switched filter 240 is configured to output a signal to an output amplifier 260, which generates an output signal at the desired frequency.

Figures 3A, 3B, 3C:
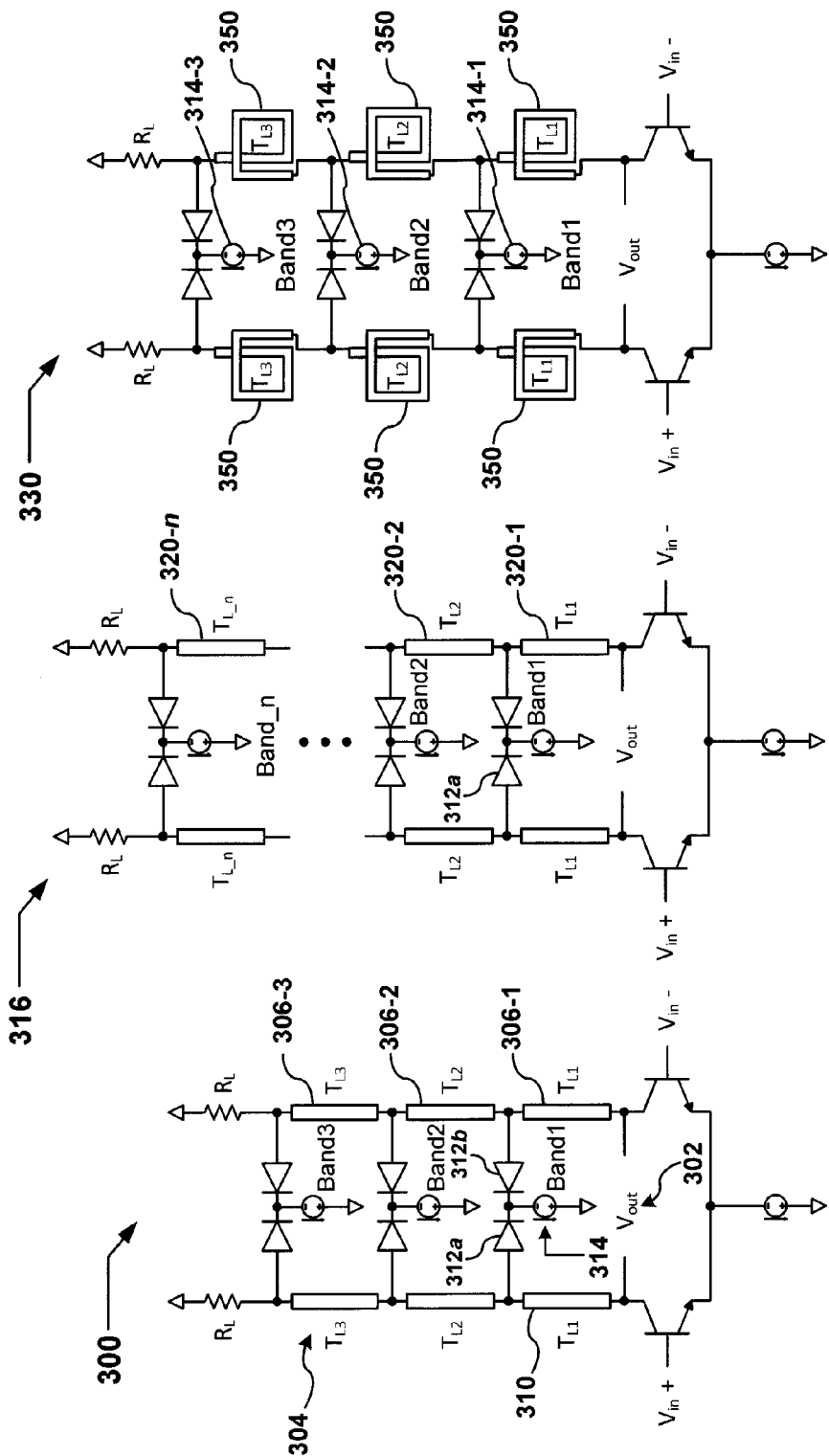
FIGS. 3A-3C are schematic diagrams of example implementations of a tripler core.

FIGS. 3A-3C are schematic diagrams of example implementations of a multi-band tripler core. FIG. 3A is a schematic diagram of a multi-band tripler core similar to the multi-band frequency multiplier core 204 in FIG. 2. Each multi-band tripler core described with reference to FIGS. 3A-3C is identified as a 'tripler' core to indicate that for the multi-band tripler core 300 in FIG. 3A, k=3 and the input frequency is to be multiplied by 3 to output the third harmonic of the input frequency. It is to be understood that a 'tripler' core is described for purposes of illustration and is not intended to limit the value of k.

The multi-band tripler core 300 in FIG. 3A includes a tripler differential pair amplifier 302. The tripler differential pair amplifier 302 is connected to a switchable load impedance 304, which includes 3 multiplier sections 306-1, 306-2, 306-3. Each of the multiplier sections 306-1 to 306-3 corresponds to a frequency multiplication band that implements a corresponding band mode. Each of the multiplier sections 306-1 to 306-3 comprises a section impedance implemented with a transmission line length 310, and a section switch implemented with a diode pair 312 and a current source switch 314 connected between the cathodes of the diode pair 312. The diode pair 312 is formed by a first diode 312a and a second diode 312b. The diodes 312a, 312b may be any suitable diode. Schottky diodes may be preferred in example implementations due to the relatively small forward-bias voltage drop and faster switching speed.

The transmission line length 310 for each of the multiplier sections 306 may be implemented as a transmission line length on each side of the section switches. Each transmission line length 310 provides an impedance on each collector of the two transistors forming the tripler differential pair amplifier 302. The configuration of the diode pairs 312 and current source switches 314 allows for the impedance to be provided at the collector of the transistor that corresponds with the diode in the diode pair 312 that is forward biased.

The output of the multi-band tripler core 300 generates an output signal having a frequency substantially equal to three times the input frequency. Each of the multiplier sections 306-1, 306-2, 306-3 may be configured such that the collector load comprises a quarter-wavelength ($\lambda/4$) resonator having a desired resonant frequency depending on which section switch is triggered. The multiplier sections 306-1, 306-2, 306-3 combine to operate as a $\lambda/4$ resonator with a resonant frequency determined by which section switch is triggered. In an example implementation of the multi-band filter core 300 in FIG. 3, three resonant frequencies may be selected to be the triple frequency, or third harmonic, of selected input frequencies that may be in a range of non-multiplied input frequencies. The components in each of the multiplier sections 306-1, 306-2, 306-3 may be selected such that the equivalent circuits formed when any of the current source switches 314 is triggered are $\lambda/4$ resonator circuits at the three selected resonant frequencies. The components to be selected include the diode pairs 312, the transmission line lengths 310, which may be inductors or any suitable guided wave structures (i.e. waveguides), and the load resistor $R_L$. One factor considered in selecting the components is the frequency response of each quarter-wavelength resonator circuit. It may be desirable to keep the Q-factor of the resonator circuit on the low side to widen the frequency response around the resonant frequency. On the other hand, in some implementations, too low a Q-factor may result in too low a gain for the quarter-wavelength resonator circuit.

The multi-band tripler core 300 in FIG. 3A includes three multiplier sections 306. In other implementations, any number of multiplier sections may be incorporated to expand the range of multiplied frequencies that can be generated. FIG. 3B illustrates an multiple band tripler core 316 having up to n multiplier sections 320-1, 320-2, . . . , 320-n. It is noted that the number of bands may be determined by the switching options of the multi-band core. For example, a multi-band filter core 300 comprises n=3 multiplier sections, but may operate in four bands that would include a band for when no switch is triggered.

As noted above, the transmission line lengths 310 in FIG. 3A may be implemented as inductors. In an example implementation, the inductors may be spiral inductors. FIG. 3C shows an example implementation of a four-band tripler core 330 that is based on the multi-band filter core 300 in FIG. 3A except that the section impedances are implemented using spiral inductors 350. Spiral inductors 350 advantageously save space for monolithic integration.

Operation of an example implementation of a multi-band frequency multiplier is described with reference to FIGS. 4-7, which are schematic diagrams of equivalent circuits formed when modes are selected. Modes are selected by triggering on the current source switch 314 corresponding to the desired mode. A pass-through mode is provided for when no switch is triggered on.

Figure 4:
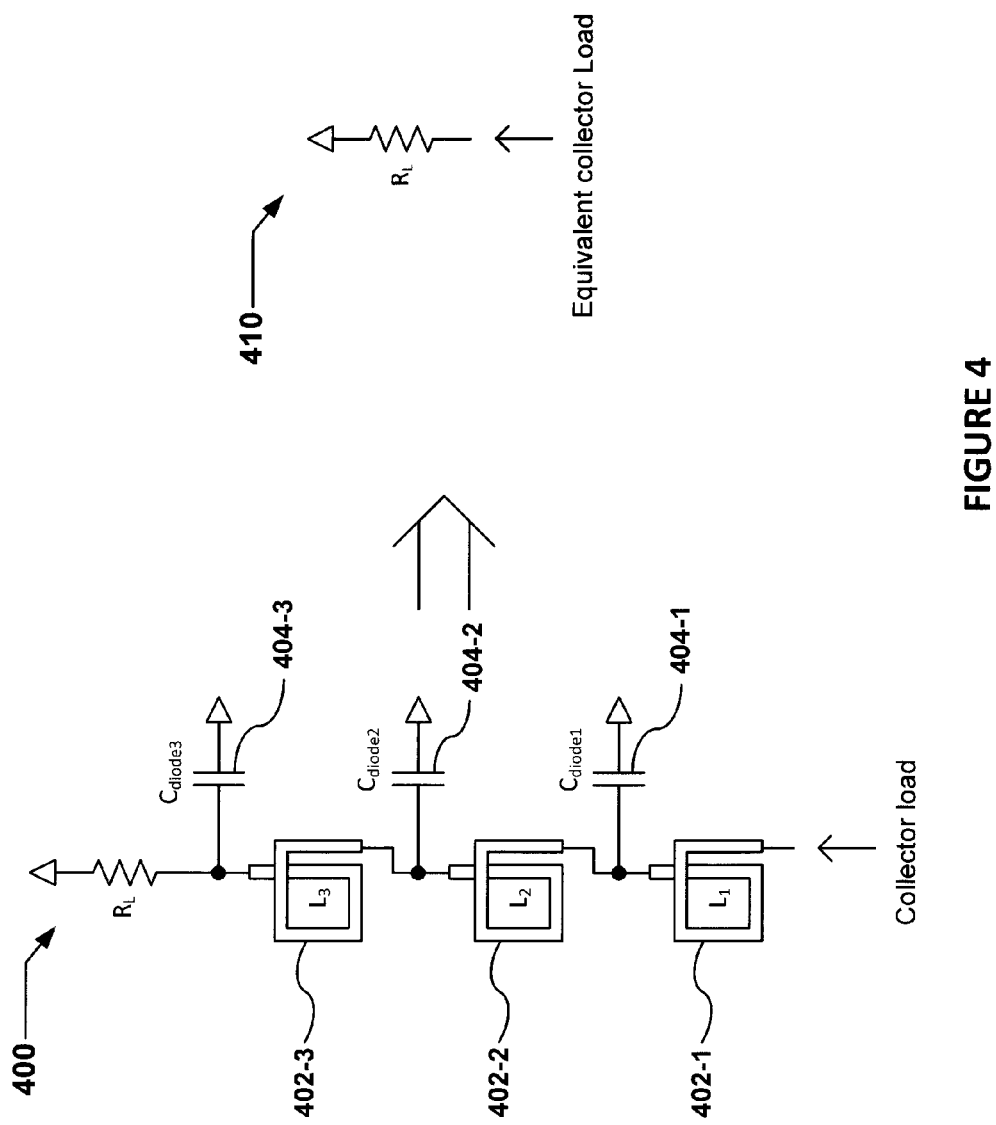
FIG. 4 is a schematic diagram of an equivalent circuit of the tripler core when the tripler core is controlled to operate in a pass-through mode.

The equivalent circuits in FIGS. 4-7 illustrate operation of the example implementation shown in FIG. 3C. FIG. 4 is a schematic diagram of a tripler core equivalent circuit 400 when the tripler core is controlled to operate in a pass-through mode. If none of the current source switches 314 are triggered on, the load on the collector of the tripler differential amplifier 302 is provided by the spiral inductors 350, and by the capacitance of the diodes in the diode pairs, which are in a reverse-biased state. The tripler core equivalent circuit 400 in FIG. 4 includes the transmission line lengths indicated by a corresponding spiral inductor 402-1, 402-2, 402-3 and equivalent diode capacitances indicated as $C_{diode1}$ 404-1, $C_{diode2}$ 404-2, $C_{diode3}$ 404-3. The diode capacitances are shown connected in parallel with the spiral inductors 402-1, 402-2, 402-3. The components in the 4-band tripler core 330 are selected so that the gain of the 4-band tripler core 330 is substantially independent of the frequency, and so that the characteristic impedance of the artificial transmission line formed by the spiral inductors 402-1, 402-2, 402-3 is the load resistor value $R_L$. Since the characteristic impedance of the artificial transmission line is $R_L$, the load presented to the collectors is $R_L$ as shown at 410 in FIG. 4. The fundamental frequency of the input signal is passed through to the output.

Figure 5:
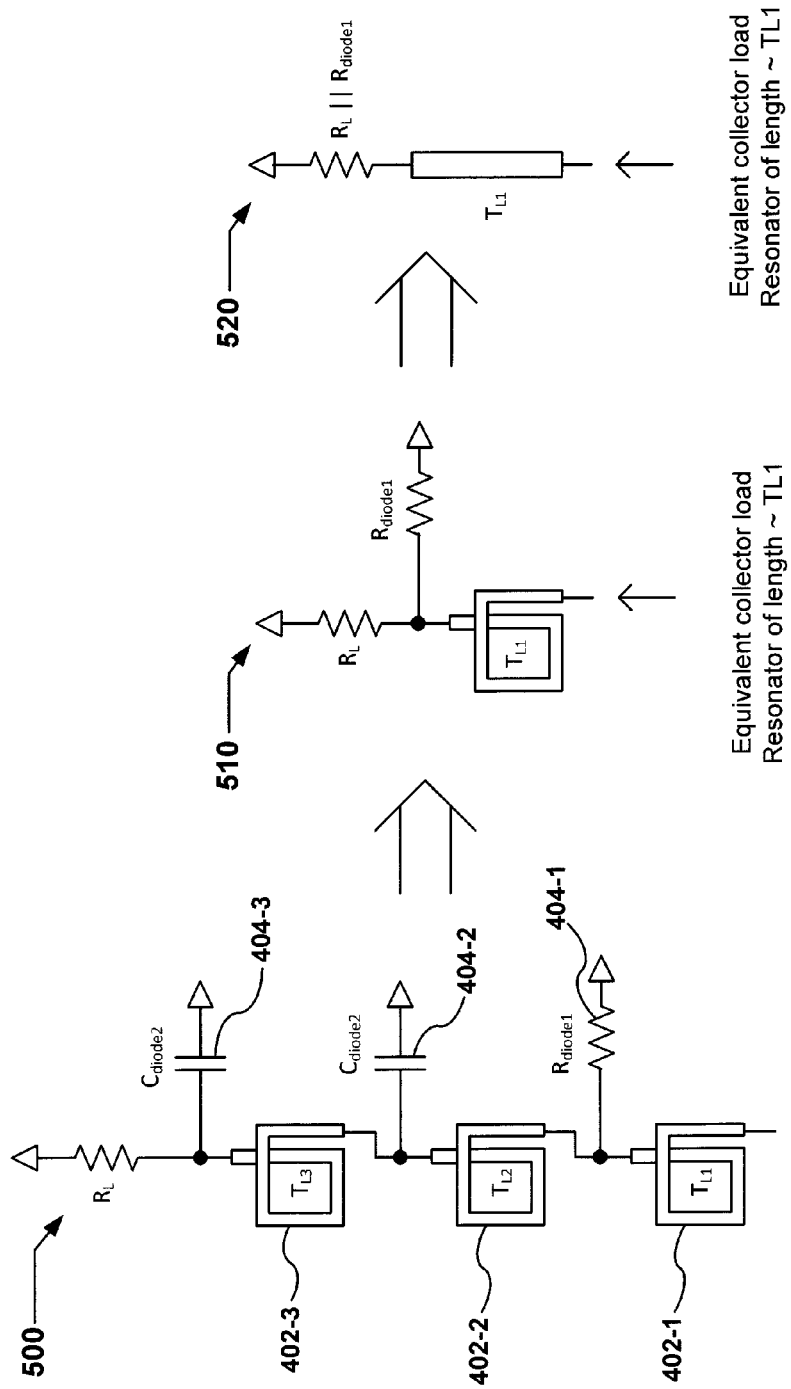
FIG. 5 is a schematic diagram of an equivalent circuit of the tripler core when the tripler core is controlled to operate in a first multiplier band mode.

FIG. 5 is a schematic diagram of an equivalent circuit 500 of the 4-band tripler core when the 4-band tripler core is controlled to operate in a first multiplier band mode. In the first multiplier band mode, the first current source switch 314-1 in FIG. 3C is triggered on. The other current source switches 314-2 and 314-3 remain in an off state. As shown in the equivalent circuit 500, the on state of the current source switch 314-1 forward biases the corresponding pair of diodes so that each diode appears as a diode resistor, $R_{diode1}$, 502, and the off state of the current source switches 314-2 and 314-3 reverse biases the diodes in the corresponding pair of diodes appear as the diode capacitors $C_{diode2}$ 404-2 and $C_{diode3}$ 404-3 as described above with reference to FIG. 4. The resistance of the diode resistor, $R_{diode1}$, 502 is the forward biased diode resistance when the diode is forward biased. The capacitance of the diode capacitors $C_{diode2}$ 404-2 and $C_{diode3}$ 404-3 is the diode capacitance when the diode is reverse-biased.

Transmission lines $T_{L2}$ and $T_{L3}$ form an artificial transmission line of impedance $R_L$ with the diode capacitors $C_{diode2}$ 404-2 and $C_{diode3}$ 404-3. The load at the collectors is presented as a transmission line of length $T_{L1}$ terminated in an impedance of the parallel combination of $R_L$ and the diode resistor, $R_{diode1}$, 502 as shown at 510 and 520. If the characteristic impedance of the artificial transmission lines is higher than the impedance of $R_L//R_{diode1}$, the impedance of $R_L//R_{diode1}$ is transformed into a higher impedance by the transmission line. At DC voltage levels, the collector impedance is $R_L//R_{diode1}$. The impedance increases as the frequency is increased until the transmission line is $\lambda/4$ in length. The frequency at the $\lambda/4$ is a first multiplier band critical frequency, $f_{0,band1}$, of the $\lambda/4$ resonator formed when in the first multiplier band mode. The critical frequency is the frequency at which the $\lambda/4$ resonator resonates. In general, the resonant frequency in the examples illustrated in FIGS. 4-7 is determined by the diode capacitances of the diodes in the n−1 switches not triggered, and a transmission line load formed by a parallel combination of the load resistor and a diode forward biased resistance of the diode of the selected one of the n switches that is triggered. As the frequency continues to increase, the impedance will start to decrease. The load at the collector appears as a damped $\lambda/4$ resonator with a resistive termination.

In the first multiplier band mode illustrated in FIG. 5, the frequency of the signal generated by the 4-band tripler core 330 in FIG. 3C is within a range of frequencies around the resonant frequency of the $\lambda/4$ resonator. The range of frequencies may be determined by selection of the component values of the components used for the 4-band tripler core 330. The 4-band tripler core 330 may be implemented to operate in a frequency multiplier such that the tripler core receives the input signal at the input frequency. In the first multiplier band mode, the 4-band tripler core 330 may be configured so that the first multiplier band critical frequency, $f_{0,band1}$, is three times a selected input frequency. The first multiplier band critical frequency, $f_{0,band1}$, is the resonant frequency of the $\lambda/4$ resonator. The range of frequencies that are generated in the first multiplier mode includes the third harmonics of a corresponding range of input frequencies. The range of frequencies generated in the first multiplier mode is also a band of frequencies with the first multiplier band critical frequency, $f_{0,band1}$ substantially at the center of the band of frequencies where the gain is expected to be the highest.

Figure 6:
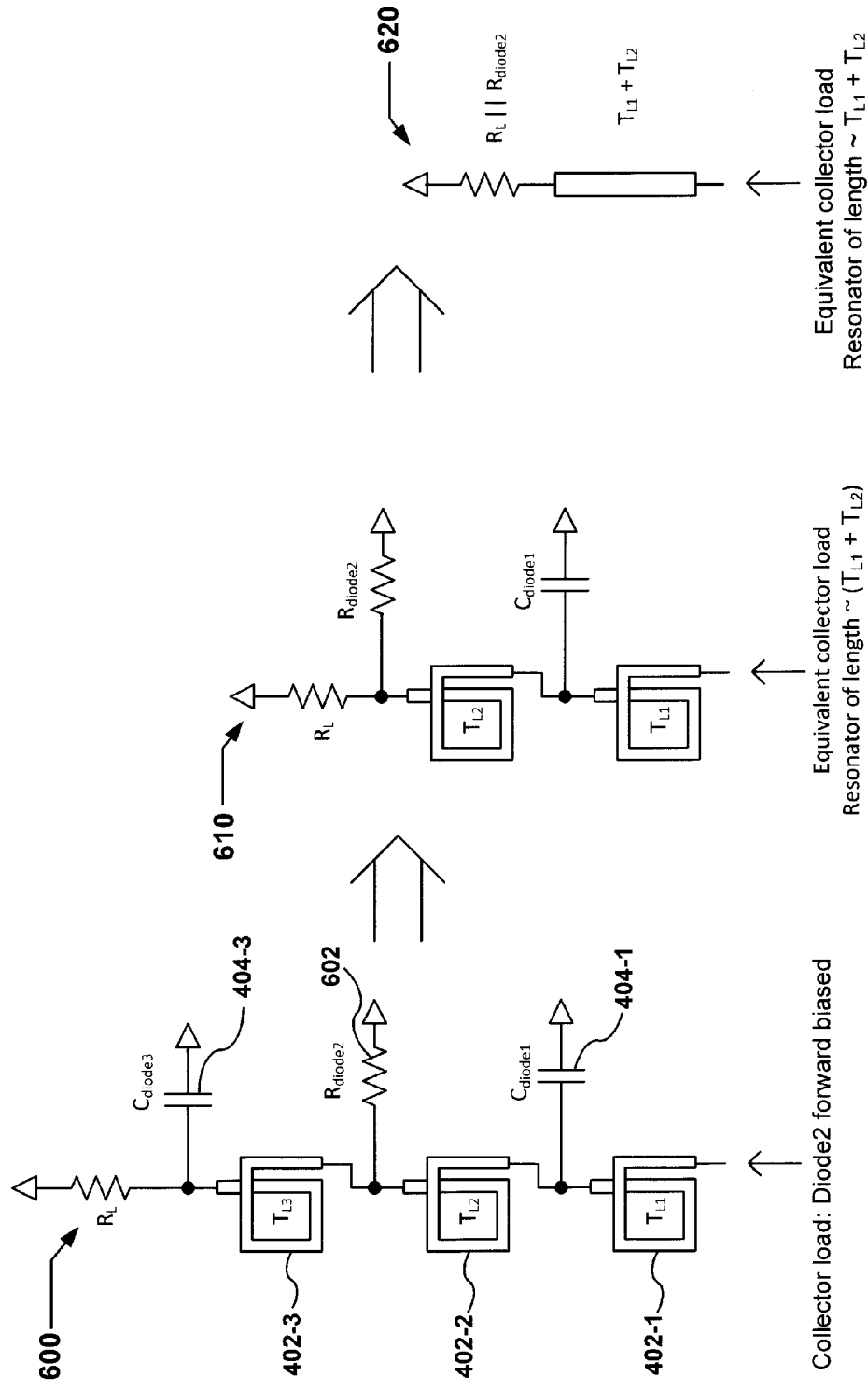
FIG. 6 is a schematic diagram of an equivalent circuit of the tripler core when the tripler core is controlled to operate in a second multiplier band mode.

FIG. 6 is a schematic diagram of an equivalent circuit 600 of the tripler core when the tripler core is controlled to operate in a second multiplier band mode. In the second multiplier band mode, the second current source switch 314-2 in FIG. 3C is triggered on. The other current source switches 314-1 and 314-3 are set to an off state. As shown in the equivalent circuit 600, the on state of the current source switch 314-2 appears as a diode resistor, $R_{diode1}$, 602, and the off state of the current source switches 314-1 and 314-3 appear as the diode capacitors $C_{diode1}$ 404-1 and $C_{diode3}$ 404-3 as described above with reference to FIG. 4.

Transmission lines $T_{L1}$ and $T_{L3}$ form an artificial transmission line of impedance $R_L$ with the diode capacitors $C_{diode1}$ 404-1 and $C_{diode3}$ 404-3. The load at the collectors is presented as a transmission line of length $T_{L1}+T_{L2}$ terminated in an impedance of $R_L$ in parallel with the diode resistor, $R_{diode2}$, 602 as shown at 610 and 620. As shown at 620, a λ/4 resonator is formed with a second multiplier band critical frequency, $f_{0,band2}$, when in the second multiplier band mode.

In the second multiplier band mode illustrated in FIG. 6, the frequency of the signal generated by the 4-band tripler core 330 in FIG. 3C is within a range of frequencies around the critical frequency, $f_{0,band2}$, of the λ/4 resonator. In the second multiplier band mode, the 4-band tripler core 330 may be configured so that the second multiplier band critical frequency, $f_{0,band2}$, is three times a selected input frequency different from the first selected input frequency for determining the first multiplier band critical frequency, $f_{0,band1}$. The range of frequencies that are generated in the second multiplier mode includes the third harmonics of a corresponding range of input frequencies. The range of frequencies generated in the second multiplier mode is also a band of frequencies with the second multiplier band critical frequency, $f_{0,band2}$ substantially at the center of the band of frequencies.

Figure 7:
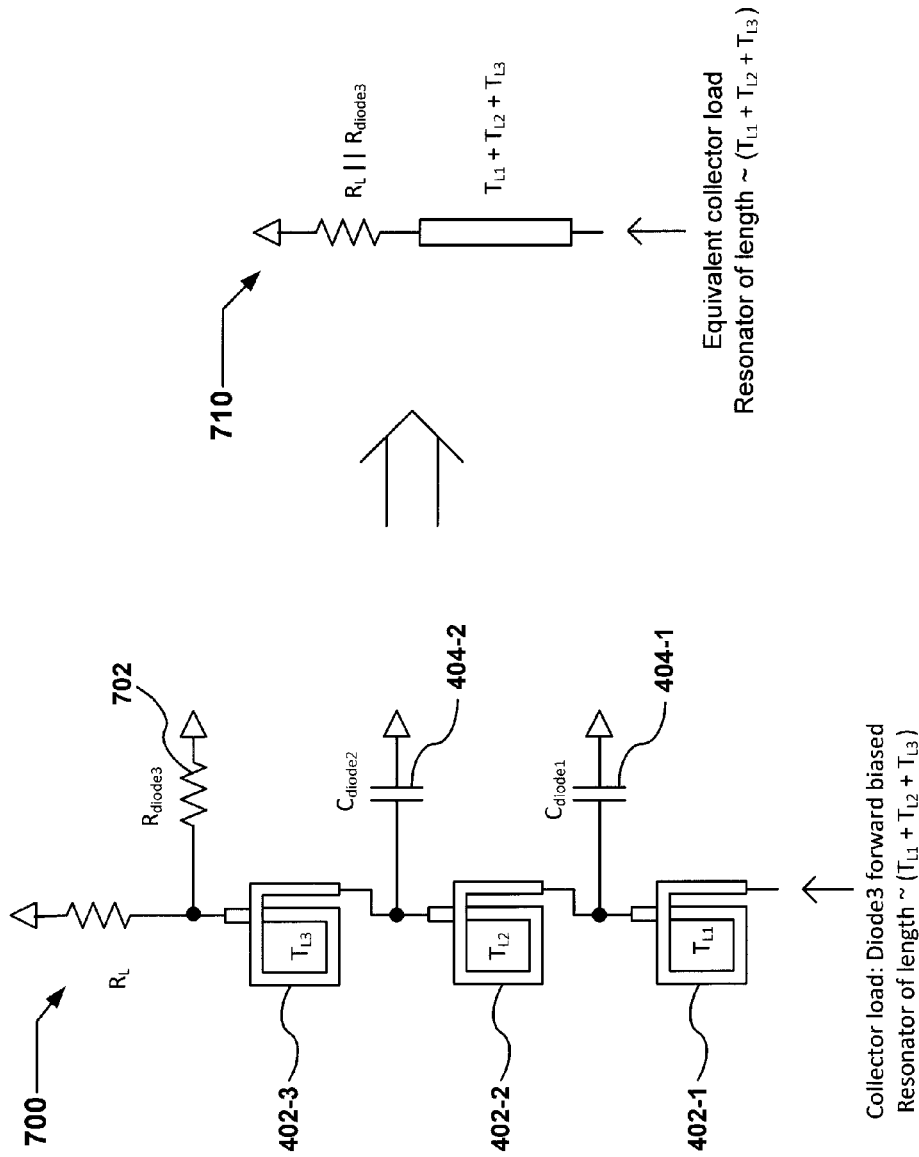
FIG. 7 is a schematic diagram of an equivalent circuit of the tripler core when the tripler core is controlled to operate in a third multiplier band mode.

FIG. 7 is a schematic diagram of an equivalent circuit 700 of the tripler core when the tripler core is controlled to operate in a third multiplier band mode. In the third multiplier band mode, the third current source switch 314-3 in FIG. 3C is triggered on. The other current source switches 314-1 and 314-2 are set to an off state. As shown in the equivalent circuit 700, the on state of the current source switch 314-3 appears as a diode resistor, $R_{diode3}$, 702, and the off state of the current source switches 314-1 and 314-2 appear as the diode capacitors $C_{diode1}$ 404-1 and $C_{diode2}$ 404-2 as described above with reference to FIG. 4.

Transmission lines $T_{L1}$, $T_{L2}$, and $T_{L3}$ form an artificial transmission line of impedance $R_L$ with the diode capacitors $C_{diode1}$ 404-1 and $C_{diode2}$ 404-2. The load at the collectors is presented as a transmission line of length $T_{L1}+T_{L2}+T_{L3}$ terminated in an impedance of $R_L$ in parallel with the diode resistor, $R_{diode3}$, 702 as shown at 710. As shown at 710, a λ/4 resonator is formed with a second multiplier band critical frequency, $k_{0,band3}$, when in the third multiplier band mode.

In the third multiplier band mode illustrated in FIG. 7, the frequency of the signal generated by the 4-band tripler core 330 in FIG. 3C is within a range of frequencies around the critical frequency, $f_{0,band3}$, of the λ/4 resonator. In the third multiplier band mode, the 4-band tripler core 330 may be configured so that the third multiplier band critical frequency, $f_{0,band3}$, is three times a selected input frequency different from the first selected input frequency for determining the first multiplier band critical frequency, $f_{0,band1}$, and the second selected input frequency for determining the second multiplier band critical frequency, $f_{0,band2}$. The range of frequencies that are generated in the third multiplier mode includes the third harmonics of a corresponding range of input frequencies. The range of frequencies generated in the third multiplier mode is also a band of frequencies with the third multiplier band critical frequency, $f_{0,band3}$ substantially at the center of the band of frequencies.

Referring back to FIG. 3C, the 4-band tripler core 330 may be switched to select to output signals with frequencies in either a pass-through band, a first multiplier band, a second multiplier band, and a third multiplier band corresponding to the multiplier band modes described with reference to FIGS. 4-7. Each multiplier band may be defined by the multiplier band resonant frequency corresponding to the multiplier band modes. When an output signal with a specific frequency is desired, the user may first determine if the frequency is within a range of frequencies that may be generated with frequency multiplication. For example, a frequency generator may be rated to generate frequencies with a range of 0 to 10 Ghz. If the desired frequency is within the 0 to 10 Ghz range, the 4-band tripler core 330 may be set to operate in the pass-through mode. The user sets the frequency generator to generate the desired frequency. The 4-band tripler core 330 passes through the signal at the desired frequency.

If the user desires a signal with a frequency that is greater than the range of 0 to 10 Ghz, the user determines which mode provides a range of frequencies that includes the desired frequency. For example, in an example implementation of the 4-band tripler core 330 provides for a first multiplier mode having a first multiplier band resonant frequency, $f_{r,band1}$, set to 27 Ghz, and the 4-band tripler core 330 is configured to provide a frequency range of 24 Ghz to 30 Ghz in the first multiplier mode. The user desires to generate a signal with a frequency of 30 Ghz. The user selects the frequency generator to generate a frequency of 10 Ghz and the 4-band tripler core 330 to operate in the first multiplier mode. The 4-band tripler core 330 receives the 10 Ghz signal and all its harmonics as input. The 4-band tripler core 330 in the first multiplier mode effectively filters signals with frequencies that are not within the frequency range of 24 Ghz and 30 Ghz. The third harmonic of the 10 Ghz input signal is the desired 30 Ghz signal, which is within the range provided by the first multiplier mode.

Different ranges of multiplied frequencies may be provided in the other multiplier modes to expand the range of frequencies that can be generated. In addition, tripler cores may be cascaded to further expand the frequency range provided. For example, referring to FIG. 3A, the multi-band tripler core 300 may be a first multi-band frequency tripler, where a second multi-band frequency tripler is connected in a cascaded configuration with the first multi-band frequency tripler.

Figure 8:
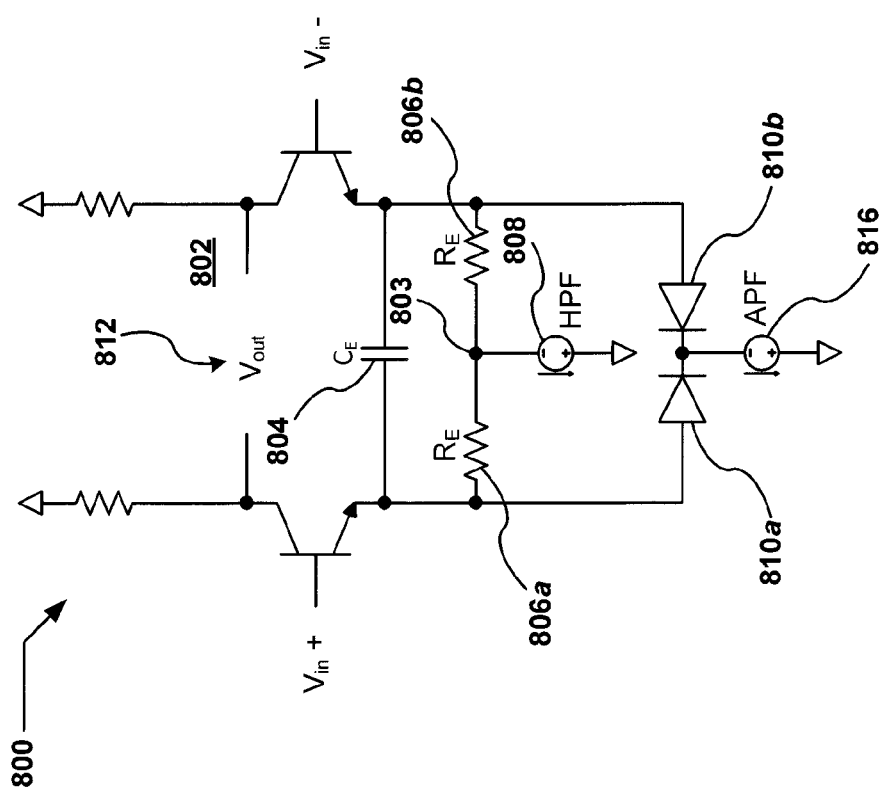
FIG. 8 is a schematic diagram of a switched filter configured to selectively filter an output frequency of the tripler core.

FIG. 8 is a schematic diagram of a switched filter 800 configured to selectively filter an output frequency of the tripler core. The switched filter 800 is similar to the switched filter 240 in FIG. 2. The switched filter 800 includes a filter input amplifier 802, shown in FIG. 8 as implemented using a differential amplifier with a first transistor 802a and a second transistor 802b. A filter capacitor 804 is connected to an emitter on the first transistor 802a and an emitter on the second transistor 802b. A series-connected filter resistor pair 806, with a first filter resistor 806a and a second filter resistor 806b, is connected in parallel with the filter capacitor 804 across the emitter of the first transistor 802a and the emitter of the second transistor 802b. A filter diode pair 810 formed with a first diode 810a and a second diode 810b is connected in parallel with the filter capacitor 804 across the emitter of the first transistor 802a and the emitter of the second transistor 802b. The filter diode pair 810 is connected so that each diode 810a, 810b of the diode pair 810 is forward biased towards a switch node 803 between the diode pair 810. The switch node 803 connects to the cathode of each diode in the filter diode pair 810.

Two switches are provided in the switched filter 800 circuit. An all-pass filter switch 816 is connected at the switch node 803 to forward-bias each diode in the filter diode pair 810 when the all-pass filter switch 816 is triggered on. In operation, the all-pass filter switch 816 may be used when the 4-band tripler core 330 (in FIG. 3C, for example) is operating in a pass-through mode. The second switch is a high-pass filter switch 808 connected at a node between the resistors 806a, 806b in the series-connected filter resistor pair 806. The high-pass filter switch 808 sinks each resistor when turned on to reverse bias each diode in the filter diode pair 810. In the high-pass filter mode, frequencies higher than a selected frequency are passed to the output of the frequency multiplier while frequencies lower than the selected frequency are suppressed. The high-pass filter mode may be selected when generating multiplied frequencies and it is desired to further suppress the fundamental frequency, or the input frequency to the frequency multiplier.

Figure 9:
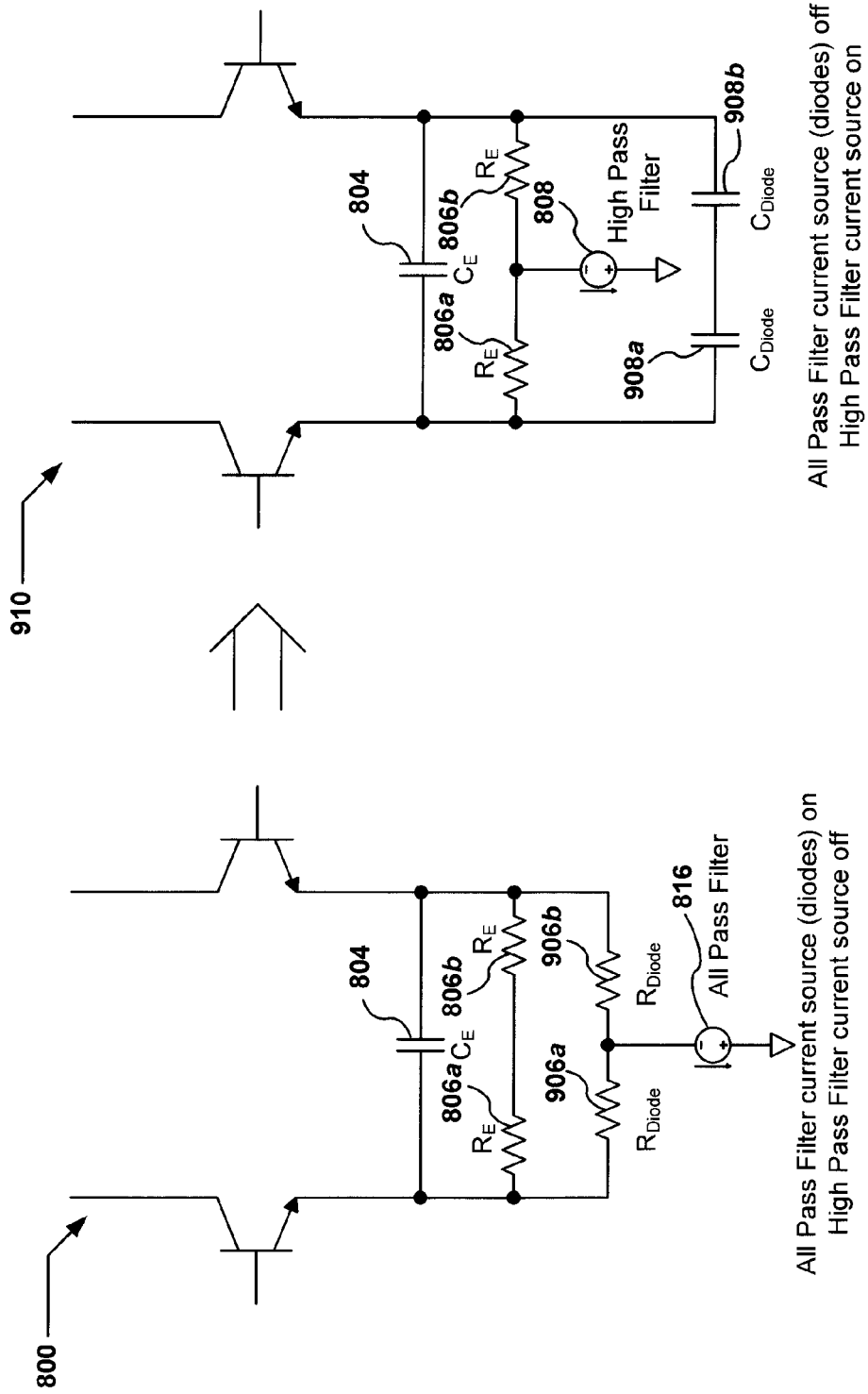
FIG. 9 is a schematic diagram of an equivalent circuit of the switched filter in FIG. 8 in a high-pass filter mode and an all-pass filter mode.

FIG. 9 is a schematic diagram of equivalent circuit 900, 910 illustrating operation of the switched filter 800 in FIG. 8 in a high-pass filter mode and an all-pass filter mode. The first equivalent circuit 900 illustrates operation in the all-pass filter mode. The all-pass filter mode is selected by triggering the all-pass filter switch 816 to the on state to forward bias the diodes in the filter diode pair 810. The diodes in the filter diode pair 810 appear as resistors, $R_{diode}$ 906a,b. The values of the resistors, $R_{diode}$ 906a,b, resistors 806a, 806b, and the filter capacitor 804 (indicated as having capacitance $C_E$) are selected to configure the switched filter 800 to pass all frequencies.

The second equivalent circuit 910 illustrates operation in the high-pass filter mode. The high-pass filter mode is selected by triggering the high-pass filter switch 808 to the on state to reverse bias the diodes in the filter diode pair 810. The diodes in the filter diode pair 810 appear as series-connected capacitors, $C_{diode}$ 908a,b. The values of the series-connected capacitors, $C_{diode}$ 908a,b, the resistors 806a, 806b, and the filter capacitor 804 are selected to determine a critical frequency and to configure the switched filter 800 to operate as a high-pass filter.

Figure 10:
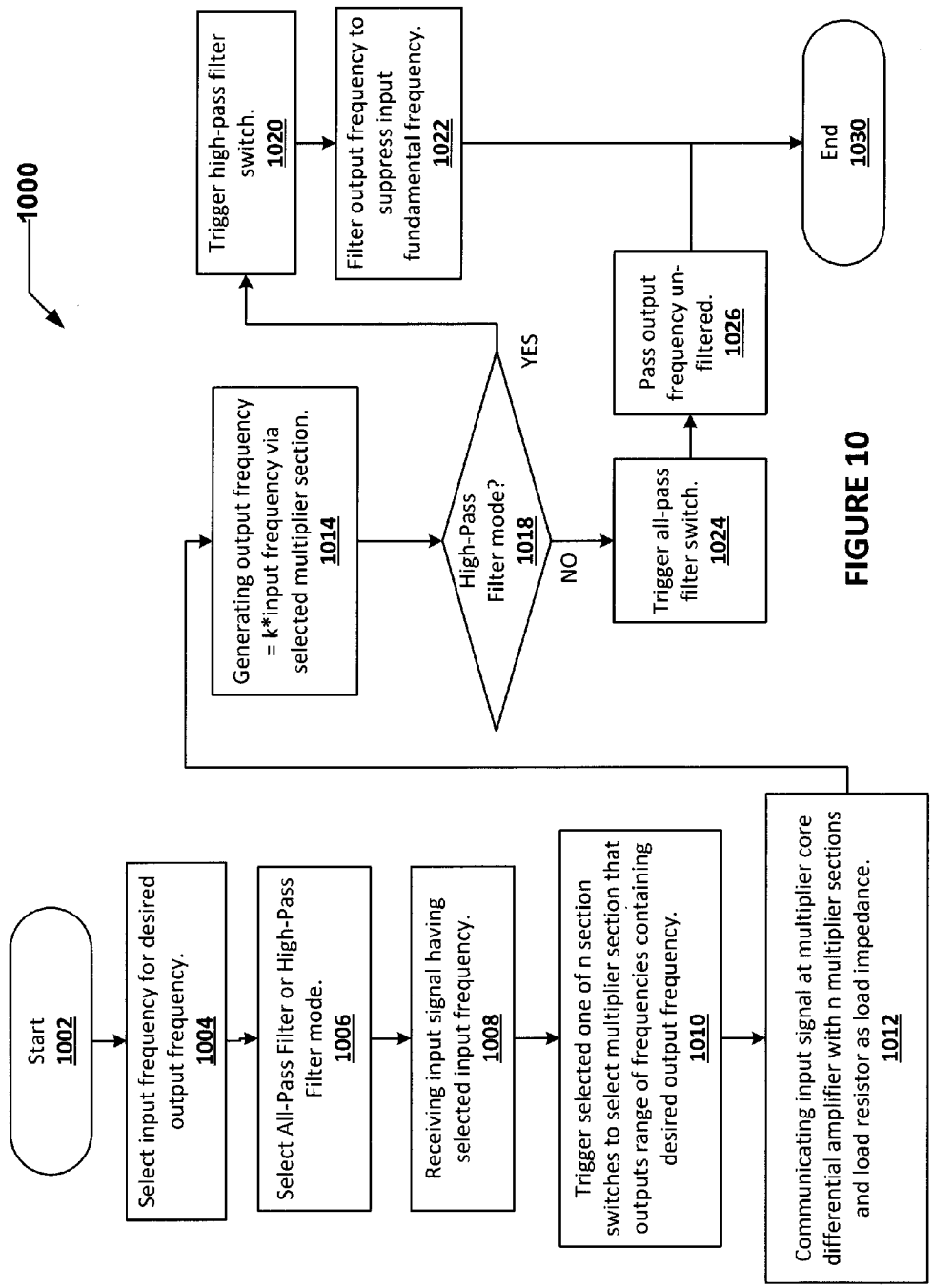
FIG. 10 is a flowchart illustrating operation of an example implementation of a switchable multi-band frequency multiplier with switched post-filtering.

FIG. 10 is a flowchart 1000 illustrating operation of an example implementation of a switchable multi-band frequency multiplier with switched post-filtering. The method illustrated in flowchart 1000 may be performed using a hardware implementation of the frequency multiplier 200 shown in FIG. 2. References to components in the following description are will be understood to be to components described with reference to FIG. 2 above unless otherwise stated.

A signal may be generated to have a frequency that is the frequency of an input signal multiplied by k. The frequency multiplier 200 may provide a user with a first band of input frequencies to select from as well as multiple bands of frequencies generated by multiplying a frequency from the first band. The user starts the method of generating a signal with a desired frequency at step 1002 by determining an input frequency from the first band of frequencies that when multiplied by a value k indicative of a selected harmonic of the input frequency would yield the desired output frequency. The user selects the input frequency at step 1004 and an all-pass filter or high-pass filter mode at step 1006. The all-pass filter mode is selected if the user is not concerned with further suppressing the fundamental input frequency at the output. The high-pass filter mode is selected if the user desires to further suppress the fundamental input frequency and the desired output frequency is above the cutoff of the high-pass filter inserted in the high-pass filter mode.

At step 1008, the input signal is received at the frequency multiplier at the selected input frequency. At step 1010, a selected one of n section switches is triggered to select the one of n multiplier sections that pass a frequency range that contains the desired output frequency. The frequency multiplier 200 in FIG. 2 comprises n=3 multiplier sections. At step 1012, the input signal is communicated to the multiplier core differential amplifier 206. As described above with reference to FIG. 2, the multiplier core differential amplifier 206 includes a switchable impedance comprising the three multiplier sections 210 corresponding to the three frequency multiplication bands. At step 1014, an output frequency is generated by the multiplier core differential amplifier 206 that is equal to k×the input frequency. In an example implementation, k=3 and the output frequency is three times the input frequency in the band corresponding to the selected multiplier section.

At decision block 1018, the selection of the post-filtering selection is made. If the high-pass filtering mode was selected, a high-pass filter switch is triggered at step 1020. It is noted that the triggering of the high-pass filter switch or the all-pass filter switch may be coincident with the selection of the mode selection at step 1006. The triggering of the filter switch is shown in FIG. 10 to illustrate a logical flow of the method and not necessarily a chronological flow of the steps.

At step 1022, the output frequency is filtered at the high end of a selected frequency band that encompasses the entire range of frequencies that can be generated by the frequency multiplier. A cutoff frequency may be selected for the high-pass filter by determining a frequency around which suppression of the input fundamental frequency is desired. The output frequency is then generated with added suppression of the fundamental frequency.

If at decision block 1018 it is determined by the selection of the filter mode that the all-pass filter mode is selected, the all-pass filter switch is selected at step 1024. The all-pass filter switch essentially permits the output signal to pass unfiltered as shown at step 1026.

Figure 11:
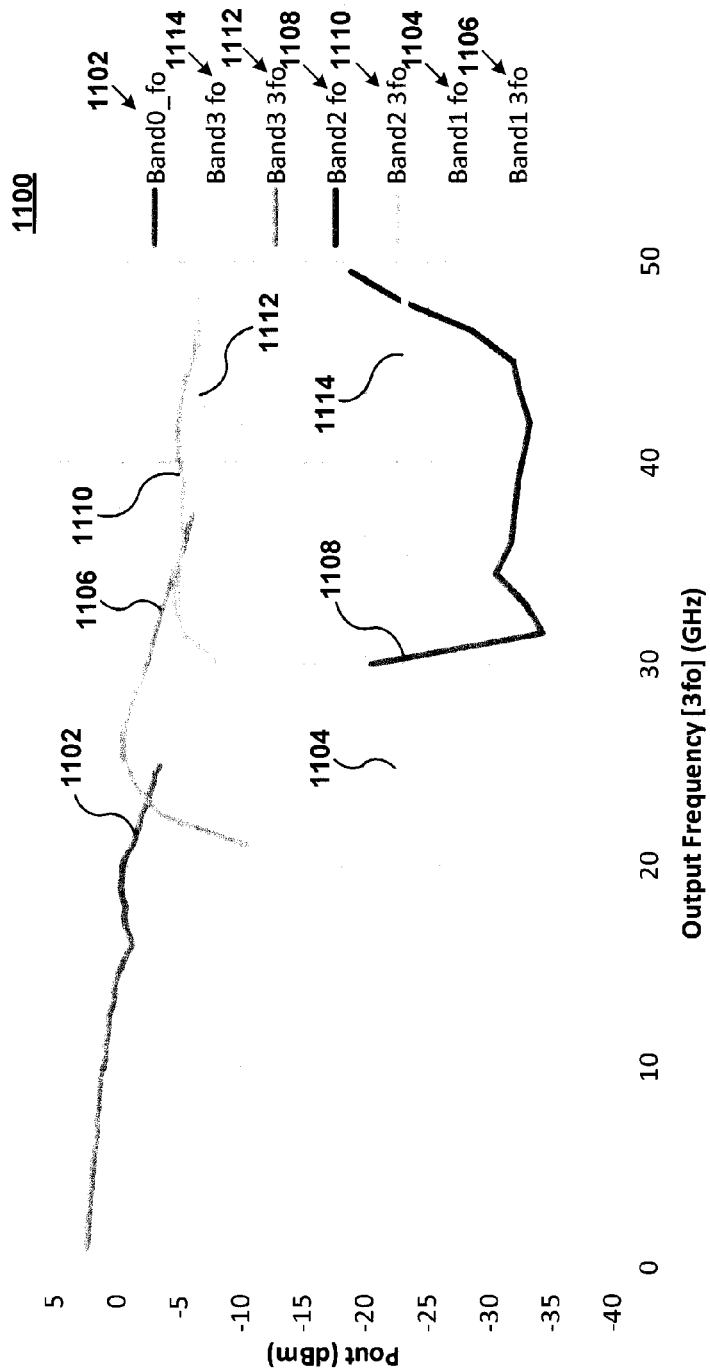
FIG. 11 is a graph of measured output power in a range of frequencies and multiplied frequencies for an example implementation of a frequency multiplier that uses a four-band tripler core.

FIG. 11 is a graph 1100 of measured output power in a range of frequencies and multiplied frequencies for an example implementation of a frequency multiplier that uses a four-band tripler core. The example implementation of the frequency multiplier used to generate data for the graph 1100 in FIG. 11 may utilize a four-band tripler core of the type described above with reference to FIG. 2, 3A or 3C. The frequency multiplier used to generate the data for the graph 1100 in FIG. 11 may be used with a frequency generator, or a test instrument that provides frequencies in a first low range in a denoted as Band0. The graph 1100 shows the power output for the Band0 range at the Band0_$f_0$ power plot 1102. A 4-band tripler core may be switched to provide three multiplier modes and a pass-through mode.

In the first multiplier mode, a multiplied frequency band, Band1__3$f_0$, is provided as three times a selected Band1 fundamental frequency band, Band1_$f_0$. The graph 1100 shows the power output for the multiplied frequency band, Band1__3$f_0$, at the Band1__3$f_0$ power plot 1112, and the power output for the Band1 range at the Band1_$f_0$ power plot 1114. The separation between the Band1__3$f_0$ power plot 1112, and the Band1_$f_0$ power plot 1114 is indicative of the extent to which the fundamental frequency in the Band1_$f_0$ range, or the input frequency to the frequency multiplier, is suppressed.

In the second multiplier mode, a multiplied frequency band, Band2__3$f_0$, is provided as three times a selected Band2 fundamental frequency band, Band2_$f_0$. The graph 1100 shows the power output for the multiplied frequency band, Band2__3$f_0$, at the Band2__3$f_0$ power plot 1110, and the power output for the Band2 range at the Band2_$f_0$ power plot 1108. The separation between the Band2__3$f_0$ power plot 1110, and the Band2_$f_0$ power plot 1108 is indicative of the extent to which the fundamental frequency in the Band2_$f_0$ range is suppressed.

In the third multiplier mode, a multiplied frequency band, Band3__3$f_0$, is provided as three times a selected Band3 fundamental frequency band, Band3_$f_0$. The graph 1100 shows the power output for the multiplied frequency band, Band3__3$f_0$, at the Band3__3$f_0$ power plot 1106, and the power output for the Band3 range at the Band3_$f_0$ power plot 1104. The separation between the Band3__3$f_0$ power plot 1104 and the Band3_$f_0$ power plot 1106 is indicative of the extent to which the fundamental frequency in the Band3_$f_0$ range is suppressed.

In general, terms such as "communicate" and "in . . . communication with" (for example, a first component "communicates with" or "is in communication with" a second component) are used herein to indicate a structural, functional, mechanical, electrical, signal, optical, magnetic, electromagnetic, ionic or fluidic relationship between two or more components or elements. As such, the fact that one component is said to communicate with a second component is not intended to exclude the possibility that additional components may be present between, and/or operatively associated or engaged with, the first and second components.

Implementations of frequency multipliers and multiplier cores are described herein as examples and are not intended to be limiting. It will be understood that various aspects or details of the invention may be changed without departing from the scope of the invention. Furthermore, the foregoing description is for the purpose of illustration only, and not for the purpose of limitation—the invention being defined by the claims.

What is claimed is:

1. A frequency multiplier comprising:
   an input amplifier configured to receive a frequency multiplier input signal having an input frequency, and to generate a suitably amplified frequency multiplier input signal;
   a multi-band multiplier core comprising:
      a multiplier core differential amplifier configured to receive the multiplier input signal, and a multiplier core differential output; and
      a switchable load impedance connected to the multiplier core differential output, the switchable load impedance comprising n multiplier sections, each multiplier section comprising a section impedance and a section switch, where the multiplier core differential output generates an output signal having an output frequency substantially equal to k times the input frequency, where the output frequency is in a range of a selected one of n critical frequencies when a selected one of the section switches corresponding to the selected one of the n critical frequencies is triggered; and
      a load resistor connected to the switchable load impedance opposite the multiplier core differential output, where the section impedance for each of the n multiplier sections has an impedance value selected such that:
   when no switch is triggered, the multi-band multiplier core operates in a pass-through band that generates a frequency multiplier output signal at the input frequency;
   when a selected one of the n switches is triggered, the multi-band multiplier core operates in one of n multiplier bands to generate a $k^{th}$ harmonic of the frequency multiplier input signal in a range of the one of the n critical frequencies corresponding to the selected switch.

2. The frequency multiplier of claim 1 where, when the selected one of the n switches is triggered:
   the n multiplier sections combine to operate as a $\lambda/4$ resonator with a resonant frequency that is a $k^{th}$ harmonic of a frequency that is 1/k of the one of n critical frequencies corresponding to the selected switch.

3. The frequency multiplier of claim 2 where:
   each of the n switches includes:
      a pair of diodes each connected in signal communication with a corresponding one of the multiplier core differential output, each diode in the pair of diodes having a diode capacitance when the diode is reverse-biased and a diode forward biased resistance when the diode is forward biased; and
      a current source switch connected to the pair of diodes to forward bias each diode when the current source switch is switched to source current, and when the multiplier core differential output corresponding to the diode forward biases the diode; and
   the section impedance of each of the n multiplier sections includes:
      a transmission line length, where the resonant frequencies of the $\lambda/4$ resonators formed when the selected ones of the n switches are triggered are determined by the diode capacitances of the diodes in the n−1 switches not triggered, and a transmission line load formed by a parallel combination of the load resistor and a diode forward biased resistance of the diode of the selected one of the n switches that is triggered.

4. The frequency multiplier of claim 3 where the section impedance of each of the n multiplier sections includes a spiral inductor.

5. The frequency multiplier of claim 1 further comprising:
   a switched filter connected in signal communication with the multiplier core differential output, the switched filter comprising:
      a filter differential pair amplifier comprising a first transistor and a second transistor;
      a filter capacitor connected across an emitter on the first transistor and an emitter on the second transistor;
      a series-connected filter resistor pair connected in parallel with the filter capacitor across the emitter of the first transistor and the emitter of the second transistor;
      a filter diode pair connected in parallel with the filter capacitor across the emitter of the first transistor and the emitter of the second transistor, the filter diode pair connected to forward bias towards a switch node between the filter diode pair;
      an all-pass filter switch connected at the switch node to forward-bias each diode when triggered on to output a signal at the input frequency in a pass-through mode; and
      a high-pass filter switch connected between the series-connected filter resistor pair to sink each resistor to reverse bias each diode to generate a multiplied frequency while suppressing the input frequency.

6. The frequency multiplier of claim 1 where the multi-band multiplier core is a first multi-band frequency tripler, the frequency multiplier further comprising:
   a second multi-band frequency tripler connected in a cascaded configuration with the first multi-band frequency tripler.

7. The frequency multiplier of claim 4 where the input amplifier is implemented using an input differential limiting amplifier configured to generate a square wave.

8. An integrated multi-band multiplier core comprising:
   a multiplier core differential amplifier configured to receive an input signal at an input frequency, the multiplier core differential amplifier comprising a multiplier core differential output;
   a switchable load impedance connected to the multiplier core differential output, the switchable load impedance comprising n multiplier sections, each multiplier section comprising a section impedance and a section switch where the multiplier core differential output generates an output signal having a frequency substantially equal to k times the input frequency in a range of a selected one of n critical frequencies when a selected one of the section switches corresponding to the selected one of the n critical frequencies is triggered; and a load resistor connected to the switchable load impedance opposite the multiplier core differential output.

9. The integrated multi-band multiplier core of claim 8 where the section impedance for each of the n multiplier sections has an impedance value selected such that:

when no section switch is triggered, the integrated multi-band multiplier core operates in a pass-through band that generates the output signal at the input frequency; and when a selected one of the section switches is triggered, the integrated multi-band multiplier core generates a $k^{th}$ harmonic of the input frequency in a range of one of n critical frequency values.

10. The integrated multi-band multiplier core of claim 9 where, when the selected one of the n switches is triggered:

the n multiplier sections combine to operate as a $\lambda/4$ transmission line resonator having a resonant frequency that is a $k^{th}$ harmonic of a frequency that is 1/k of the one of n critical frequencies corresponding to the selected switch.

11. The integrated multi-band multiplier core of claim 10 where:

each of the n switches includes:

a pair of diodes each connected in signal communication with a corresponding one of the multiplier core differential output; and a current source connected to the pair of diodes to forward bias each diode when the current source is switched to source current and the multiplier core differential output corresponding to the diode is at a voltage level that forward biases the diode; and the section impedance of each of the n multiplier sections includes:

a transmission line length, where the resonant frequencies of the $\lambda/4$ resonators formed when the selected ones of the n switches are triggered are determined by the diode capacitances of the diodes in the n−1 switches not triggered, and a transmission line load formed by a parallel combination of the load resistor and a diode forward biased resistance of the diode of the selected one of the n switches that is triggered.

12. The integrated multi-band multiplier core of claim 11 where the section impedance of each of the n multiplier sections includes a spiral inductor.

13. The integrated multi-band multiplier core of claim 8 further comprising:

a switched filter connected in signal communication with the multiplier core differential output, the switched filter comprising:

a filter differential pair amplifier comprising a first transistor and a second transistor;

a filter capacitor connected across an emitter of the first transistor and an emitter of the second transistor;

a series-connected filter resistor pair connected in parallel with the filter capacitor across the emitter of the first transistor and the emitter of the second transistor;

a diode pair connected in parallel with the filter capacitor across the emitter of the first transistor and the emitter of the second transistor, the diode pair connected to forward bias towards a switch node between the diode pair;

an all-pass filter switch connected at the switch node to forward-bias each diode when triggered on; and a high-pass filter switch connected between the series-connected filter resistor pair to sink each resistor to reverse bias each diode.

14. The integrated multi-band multiplier core of claim 12 where multi-band multiplier core is implemented on a single integrated circuit.

15. The integrated multi-band multiplier core of claim 8 where the multiplier core differential amplifier, the switchable load impedance, and the load resistor form a first tripler core, the integrated multi-band multiplier core further comprising:

a second tripler core connected in a cascaded configuration with the first tripler core.

16. A method for multiplying a frequency of an input signal, the method comprising:

receiving an input signal having an input frequency;

triggering a selected one of n section switches in n corresponding multiplier sections, each of the n multiplier sections comprising a section impedance configured to form a $\lambda/4$ resonator having a resonant frequency corresponding to one of n critical frequencies, the $\lambda/4$ resonator being configured to output a range of frequencies around the resonant frequency, where the range of frequencies are $k^{th}$ harmonics of the input frequency when the selected one of the n multiplier section switches is triggered on;

communicating the input signal at a multiplier core differential amplifier comprising a multiplier core differential output with a load impedance comprising the n multiplier sections and a load resistor; and generating an output frequency substantially equal to the $k^{th}$ harmonic of the input frequency in a range surrounding the $k^{th}$ harmonic of the critical frequency.

17. The method of claim 16 where each of the n section switches includes a diode pair and a current source connected to the diode pair to forward bias each diode when the current source is switched to source current, and when the multiplier core differential output corresponding to the diode is at a voltage level that forward biases the diode, and where the step of triggering a selected one of the n section switches comprises:

switching the diode pair in the selected one of the n section switches to forward bias such that the load impedance is the load resistor in parallel with a diode resistance; and forming an artificial transmission line with an impedance including a reverse biased capacitance of the diode pairs of the n−1 section switches not selected.

18. The method of claim 17 where the step of generating the output frequency comprises:

generating the $k^{th}$ harmonic of the input frequency in a range of frequencies around a resonant frequency of a $\lambda/4$ resonator formed by the artificial transmission line.

19. The method of claim 16 where a switched filter is provided to receive the output frequency, the switched filter comprising a filter differential pair amplifier having a differential pair output, a filter capacitor connected across the differential pair output, a series-connected filter resistor pair in parallel with the filter capacitor across the differential pair output, and a diode pair connected in parallel with the filter capacitor across the differential pair output, the method further comprising:

switching on an all pass filter switch to forward bias the diode pair; and filtering the output frequency using a high pass filter formed by the filter capacitor and the series connected resistors to suppress the input frequency by switching a high pass filter switch connected between the series-connected filter resistor pair to sink each resistor to reverse bias each diode.

20. A frequency multiplier comprising:
- an input amplifier configured to receive a frequency multiplier input signal having an input frequency, and to generate a suitably amplified frequency multiplier input signal;
- a multi-band multiplier core comprising:
  - a multiplier core differential amplifier configured to receive the multiplier input signal, and a multiplier core differential output; and
  - a switchable load impedance connected to the multiplier core differential output, the switchable load impedance comprising n multiplier sections, each multiplier section comprising a section impedance and a section switch, where the multiplier core differential output generates an output signal having an output frequency substantially equal to k times the input frequency, where the output frequency is in a range of a selected one of n critical frequencies when a selected one of the section switches corresponding to the selected one of the n critical frequencies is triggered; and
- a load resistor connected to the switchable load impedance opposite the multiplier core differential output.

* * * * *